United States Patent
Fukuda

(10) Patent No.: US 7,248,338 B2
(45) Date of Patent: Jul. 24, 2007

(54) MULTI BEAM EXPOSING DEVICE AND EXPOSING METHOD USING THE SAME

(75) Inventor: Takeshi Fukuda, Kanagawa (JP)

(73) Assignee: Fujifilm Corporation, Tokyo (JP)

( * ) Notice: Subject to any disclaimer, the term of this patent is extended or adjusted under 35 U.S.C. 154(b) by 173 days.

(21) Appl. No.: 11/090,150

(22) Filed: Mar. 28, 2005

(65) Prior Publication Data
US 2005/0213071 A1    Sep. 29, 2005

(30) Foreign Application Priority Data
Mar. 29, 2004   (JP) ............................ 2004-096752

(51) Int. Cl.
G03B 27/54   (2006.01)
G03B 27/72   (2006.01)

(52) U.S. Cl. ..................... 355/67; 355/53; 355/69; 355/71

(58) Field of Classification Search ................. 355/53, 355/67, 69
See application file for complete search history.

(56) References Cited

U.S. PATENT DOCUMENTS

| | | | |
|---|---|---|---|
| 4,922,284 A * | 5/1990 | Dwyer | 355/20 |
| 5,067,798 A * | 11/1991 | Tomoyasu | 359/286 |
| 6,498,685 B1 | 12/2002 | Johnson | |
| 7,019,312 B2 * | 3/2006 | Kruit | 250/492.2 |
| 2004/0252180 A1 * | 12/2004 | Takada | 355/67 |
| 2005/0210438 A1 * | 9/2005 | Verstappen et al. | 716/21 |

* cited by examiner

Primary Examiner—D. Rutledge
(74) Attorney, Agent, or Firm—Sughrue Mion, PLLC

(57) ABSTRACT

An exposing device including means which has a plurality of pixels and modulates, per pixel, an optical beam irradiated from a light source, for exposing a plotted image on an exposure surface by modulating, per pixel, the plurality of pixels of the modulating means based on image data, the multi beam exposing device comprising: beam position detecting means for detecting exposure point positional information pertaining to an optical beam irradiated on the exposure surface from predetermined pixels to be measured of the modulating means; and positional deviation calculating means for calculating a relative positional deviation between positional information pertaining to the pixels to be measured of the modulating means and exposure point positional information pertaining to each of the optical beams projected at the exposure surface from each of the pixels to be measured detected by the use of the beam position detecting means, based on the two positional informations.

27 Claims, 14 Drawing Sheets

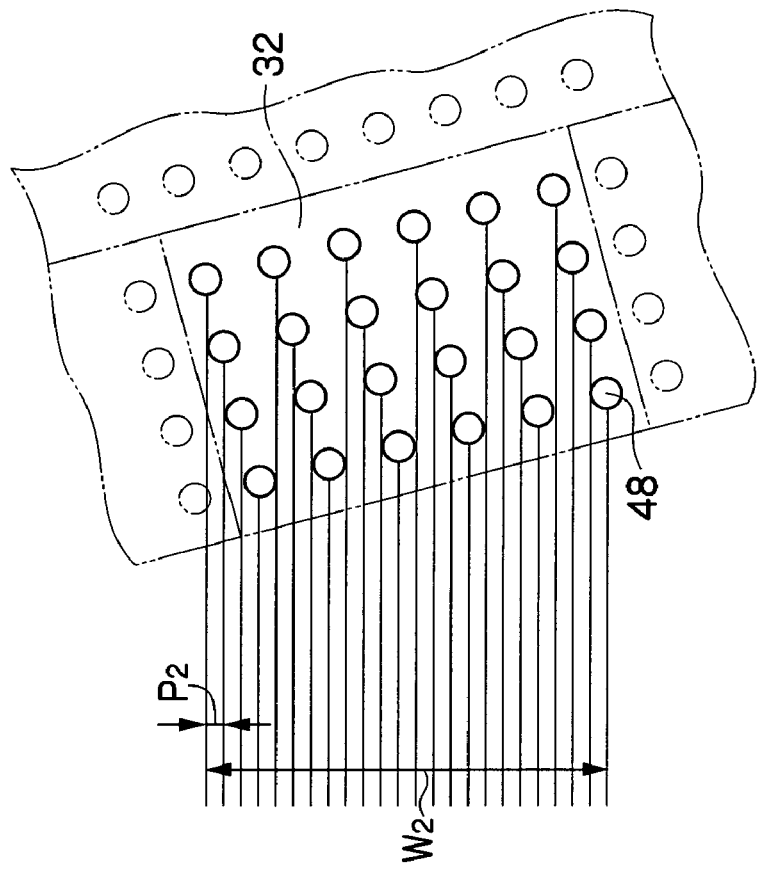
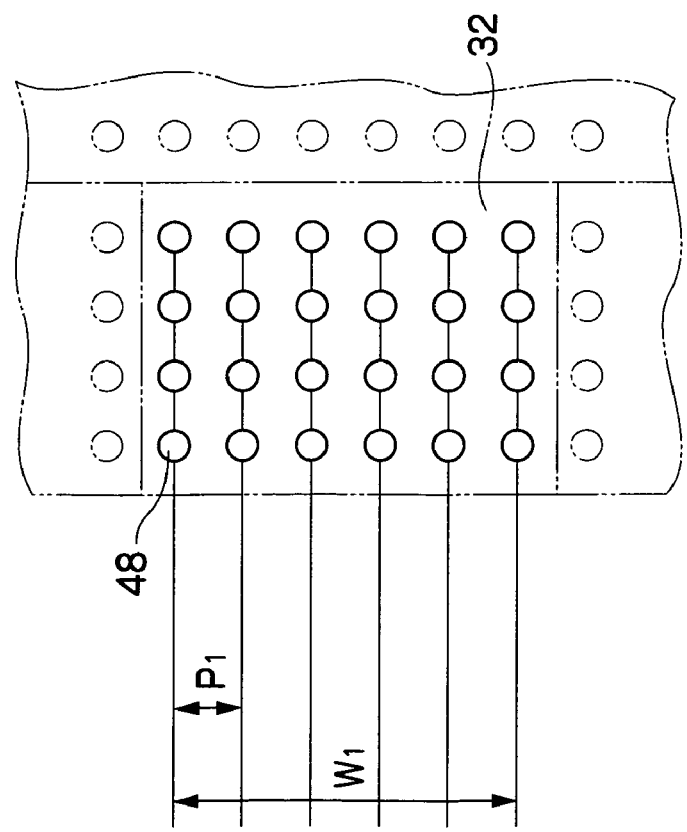

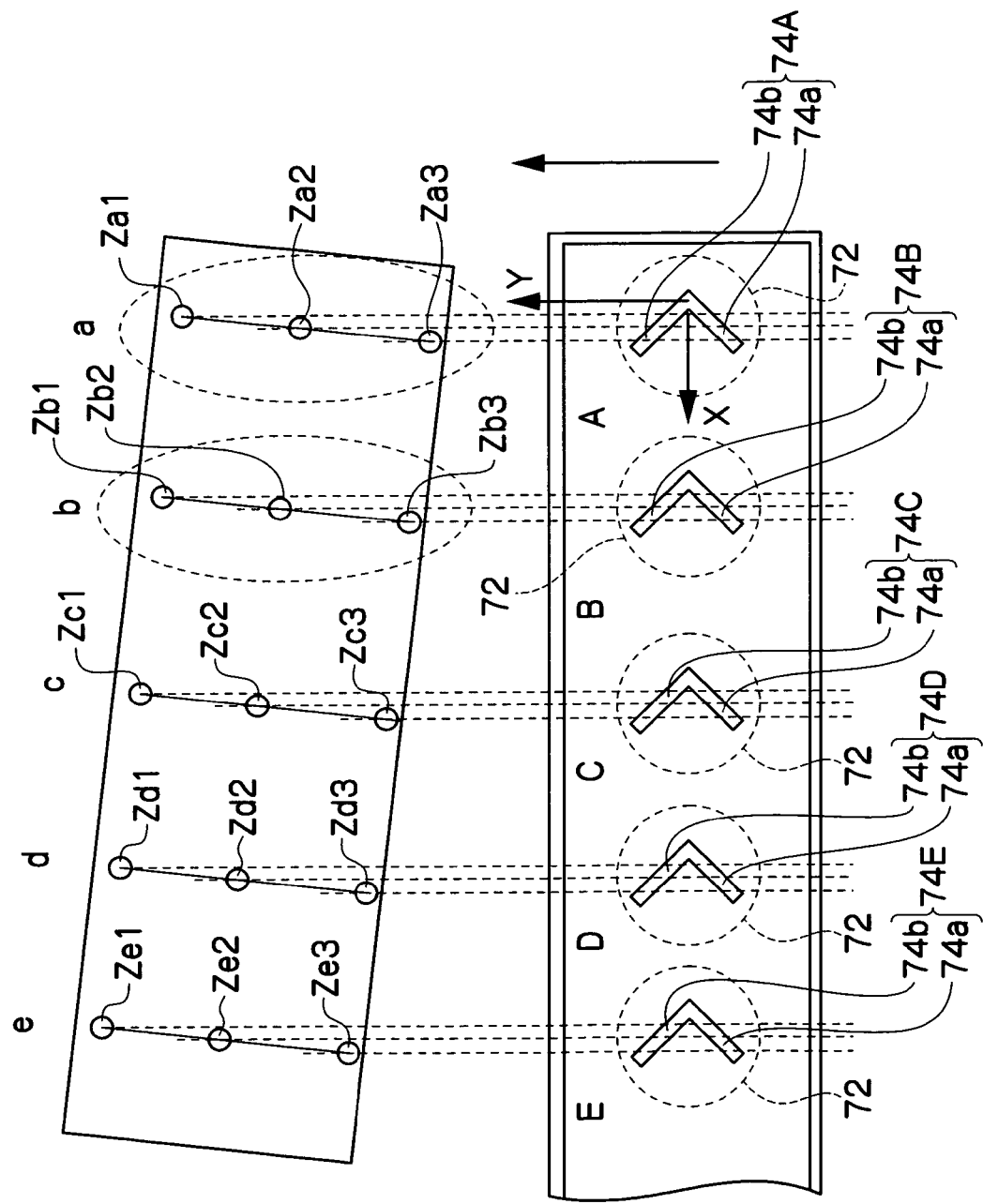

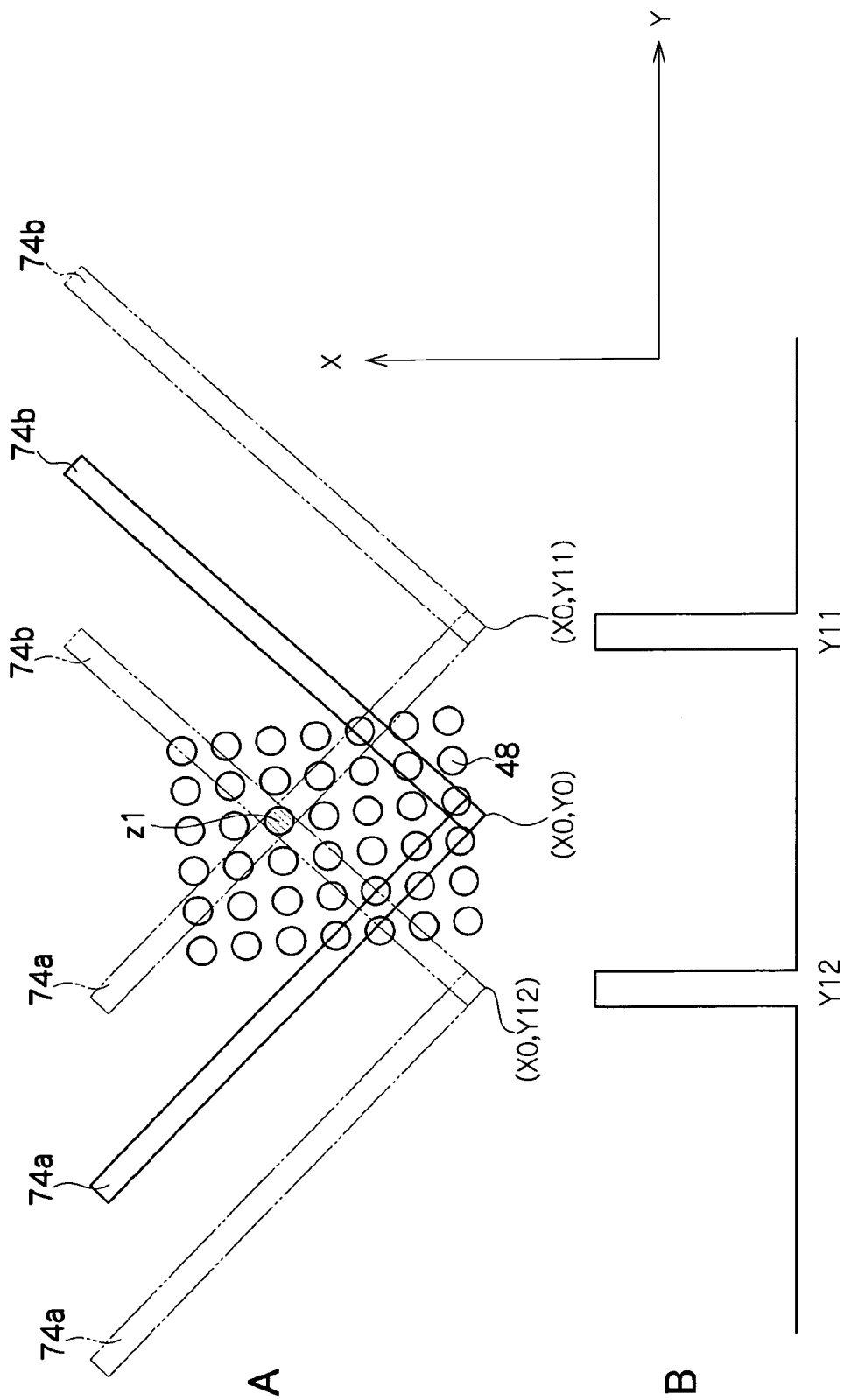

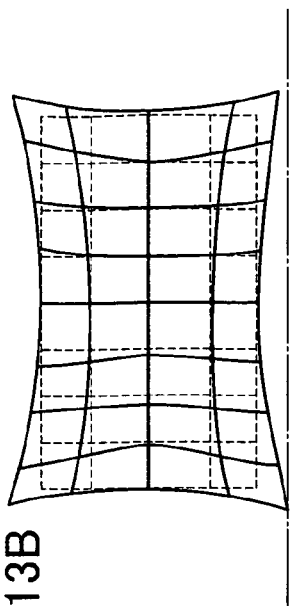
FIG.13B
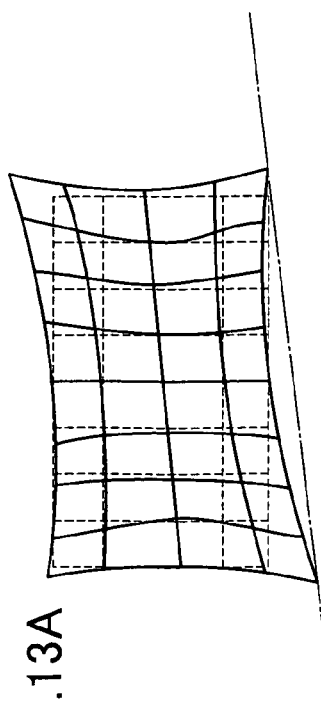
FIG.13A
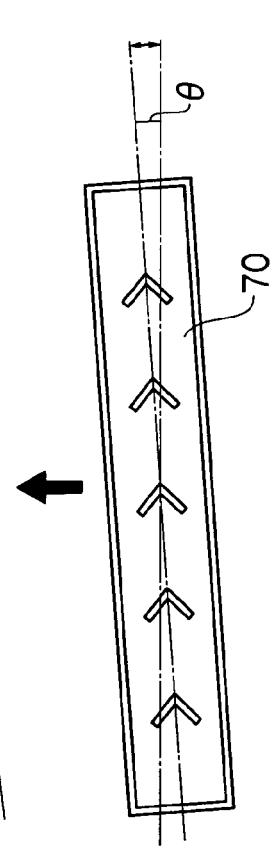
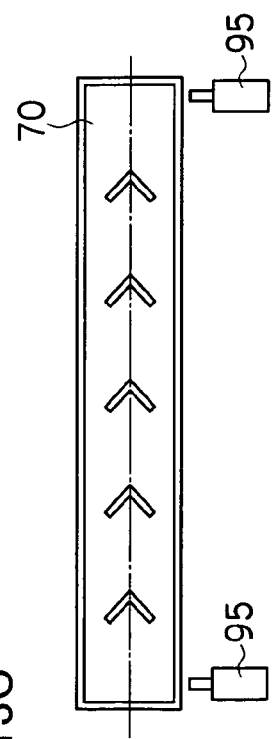
FIG.13C

MULTI BEAM EXPOSING DEVICE AND EXPOSING METHOD USING THE SAME

CROSS-REFERENCE TO RELATED APPLICATION

This application claims priority under 35 USC 119 from Japanese Patent Application No. 2004-96752, the disclosure of which is incorporated by reference herein. Reference is made to related Japanese Patent Application No. 2005-54942, the disclosure of which is incorporated by reference herein.

BACKGROUND OF THE INVENTION

1. Field of the Invention

The present invention relates to a multi beam exposing device for focusing and irradiating, per pixel, each of beams emitted from a means for selectively turning on or off a plurality of pixels such as a spatial light modulator disposed in an exposing head based on image data (i.e., pattern data), with an optical element such as a lens array, so as to expose a predetermined pattern. The present invention also relates to an exposure method using the multi beam exposing device.

2. Description of the Related Art

In recent years, there has been developed a multi beam exposing device for subjecting a member to be exposed, to image exposure with an optical beam modulated in accordance with image data, by utilizing a spatial light modulator such as a digital micro mirror device (abbreviated as "a DMD") as a pattern generator.

Such a DMD is a mirror device including numerous micro mirrors, the angle of the reflection surface of each being varied in response to, for example, a control signal, with the mirrors being arranged on a semiconductor substrate made of silicon or the like in a two-dimensional manner. The DMD is configured such that the angle of the reflection surface of the micro mirrors is varied by static electricity generated by electric charges accumulated in each of several memory cells.

In a conventional multi beam exposing device using a DMD, there is used, for example, an exposing head for collimating a laser beam emitted from a laser beam-emitting light source by means of a lens system, and reflecting each of the laser beams off the plurality of micro mirrors of the DMD that are arranged at substantially the focusing position of the lens system, so as to emit each of the beams from a plurality of beam emitting ports. Each of the beams emitted from the plurality of beam emitting ports in the exposing head is focused on the exposure surface of a photosensitive material (i.e., a member to be exposed) in a small spot diameter with a lens system having an optical element such as a micro lens array for focusing one beam per pixel with a single lens, thereby achieving image exposure with a high resolution.

In the above-described exposing device, the laser beam is modulated (i.e., deflected) by a controller, not shown, controlling the turning on or off of each of the micro mirrors in the DMD based on the control signal produced in accordance with image data or the like. Then, the exposure surface (i.e., recording surface) is exposed to the modulated laser beam by irradiation.

The exposing device is configured such that a photosensitive material (such as a photoresist) is disposed on the recording surface, and thereafter, that patternwise exposure can be performed on the photosensitive material by modulating each of the DMDs in accordance with the image data while moving the position of a beam spot relative to the photosensitive material, the beam spot being formed by irradiation of the laser beams from the plurality of exposing heads, respectively, in the multi beam exposing device on the photosensitive material.

In the case where the above-described multi beam exposing device is used in, for example, exposure of a circuit pattern on a substrate with high accuracy, there are instances where a relationship of precise similarity is not established between an image formed at the reflection surface formed by all of the micro mirrors in the DMD and an image projected at the exposure surface. This is a result of the lens for use in an illumination optical system or a focusing optical system in the exposing head having an inherent distortion characteristic. In other words, an image projected on the exposure surface may be deformed and deviate in position due to the distortion, and as a result, may not strictly match the designed circuit pattern.

In view of this, there has been proposed a means for correcting the distortion in a conventional exposing device. Such a means for correcting the distortion is adapted to set an origin at a predetermined position in the entire exposed region to be projected on a plotted surface with an exposing unit, to measure a relative position (i.e., an exposure point) of an optical image by a given micro mirror with specialized equipment before plotting, and to store the actual measurement value as exposure point coordinate data in the ROM of a system control circuit. In plotting, the actual measurement value is output as exposure point coordinate data to an exposure point coordinate data memory.

In this manner, bit data on the circuit pattern which has been substantially subjected to the distortion correction is stored in the exposure data memory. Therefore, since the exposure data to be given to each of the micro mirrors is a value with the distortion taken into account, the circuit pattern can be plotted with high accuracy even if there is distortion in the optical element in the exposing unit (see, for example, Japanese Patent Application Laid-Open (JP-A) No. 2003-57834).

In the above-described multi beam exposing device, the distortion of a plotted image caused by the exposing head varies with the lapse of time due to factors such as temperature and vibration when plotting with higher accuracy, and therefore, it is necessary to measure the distortion of a plotted image varying with the lapse of time each time before plotting with specialized equipment, so as to properly correct the distortion.

SUMMARY OF THE INVENTION

The present invention has been accomplished to solve the above-described problems experienced in the prior art. Therefore, an object of the invention is to provide a novel multi beam exposing device provided with means capable of appropriately detecting a distortion of a plotted image in order to correct the distortion of the plotted image when an image is plotted with beams emitted from means for selectively turning on or off a plurality of pixels.

In a first aspect of the invention, an exposing device including modulating means which has a plurality of pixels and modulates, per pixel, an optical beam irradiated from a light source, for exposing a plotted image on an exposure surface by modulating, per pixel, the plurality of pixels of the modulating means based on image data, the multi beam exposing device comprising: beam position detecting means for detecting exposure point positional information pertaining to an optical beam irradiated on the exposure surface from predetermined pixels to be measured of the modulating means; and positional deviation calculating means for calculating a relative positional deviation between positional information pertaining to the pixels to be measured of the modulating means and exposure point positional information pertaining to each of the optical beams projected at the exposure surface from each of the pixels to be measured detected by the use of the beam position detecting means, based on the two positional informations.

According to the first aspect, in the case where the plotted image distorts with the lapse of time due to factors such as temperature or vibration in exposure processing with the emitted beams, it is possible to obtain the magnitude of positional deviation generated in the plotted image with the positional deviation calculating means, based on the positional information detected by the beam position detecting means, and appropriately correct the positional deviation of the plotted image thus detected, thereby effecting highly precise image plotting and formation of an exposure image of high quality.

In a second aspect of the invention, the multi beam exposing device according to the first aspect, further comprises distortion calculating means for calculating a distortion of a plotted image based on the relative positional deviation calculated by the positional deviation calculating means.

According to the second aspect, in the case where the plotted image distorts with the lapse of time due to factors such as temperature or vibration in exposure processing with the emitted beams, it is possible to obtain the magnitude of distortion generated in the plotted image with the distortion calculating means, based on the positional information detected by the positional deviation calculating means, and appropriately correct the distortion of the plotted image thus detected, thereby effecting highly precise image plotting and formation of an exposure image of high quality.

In a third aspect of the invention, the multi beam exposing device according to the second aspect further comprises image data correcting means for correcting image data based on the distortion of the plotted image calculated by the distortion calculating means.

According to the third aspect, in the case where the plotted image distorts with the lapse of time due to factors such as temperature or vibration in exposure processing with the emitted beams, it is possible to appropriately correct the image data with the image data correcting means in accordance with the distortion of the plotted image thus detected, based on the information detected by the distortion calculating means, thereby effecting highly precise image plotting and formation of an exposure image of high quality.

In a fourth aspect of the invention, the beam position detecting means according to the first to third aspects includes: a slit plate disposed at an end of a stage, on which a photosensitive material to be disposed on an exposure surface is mounted and which moves in a scanning direction; a detecting slit formed on the slit plate and configured in such a shape that a first linear slit having a predetermined length and a second linear slit having a predetermined length are arranged non-parallel to each other; and optical detecting means for receiving an optical beam passing through the detecting slit.

According to the fourth aspect, the beam position detecting means of the simple configuration detects the positional information on each of the optical beams irradiated from the plurality of pixels to be measured, the pixels being dispersively located evenly within the exposure area, as required, so as to measure the distortion inherent to the projecting optical system in the exposing head or the distortion of the plotted image varied with the lapse of time due to factors such as temperature or vibration in exposure processing by the exposing head each time, thereby properly correcting the image data. Thus, it is possible to readily achieve the function and effect produced by the first aspect, so as to form an exposure image of a high quality with the highly accurate plotted image.

In a fifth aspect of the invention, an exposing device including modulating means which has a plurality of pixels and modulates, per pixel, an optical beam irradiated from a light source, for exposing a plotted image on an exposure surface by modulating, per pixel, the plurality of pixels of the modulating means based on image data, the multi beam exposing device comprising: beam position detecting means for detecting exposure point positional information pertaining to an optical beam irradiated on the exposure surface from predetermined pixels to be measured of the modulating means, which beam position detecting means measures an exposure point of the beam at two or more measurement points which are not aligned in the scanning direction with respect to the exposing head; and angle detecting means for detecting an angle, with respect to the scanning direction, of the beam position detecting means at each exposure point.

According to the fifth aspect, in the case where deviation in angle with respect to the scanning direction of the beam position detecting means is generated, with the lapse of time due to factors such as temperature or vibration, it is possible to appropriately correct the angle, in accordance with the deviation in the angle calculated based on information on the angle detected by the beam position detecting means, thereby effecting highly precise image plotting and formation of an exposure image of high quality.

In a sixth aspect, the exposure device of the fifth aspect further comprises image data correcting means for correcting, based on the angle with respect to the scanning direction of the beam position detecting means, image data to be exposed on the exposure surface, wherein the angle is detected by the angle detecting means.

According to the sixth aspect, it is possible to appropriately correct the image data in accordance with the distortion of the plotted image detected based on information in the angle, wherein the information on the angle is detected by the angle detecting means.

In a seventh aspect of the invention, the exposing of the first to sixth aspects further comprises angle adjusting means for mechanically adjusting the angle, with respect to the scanning direction, of the beam position detecting means.

According to the seventh aspect, the angle of the beam position detecting means thus detected can be calibrated, thereby enhancing precision in correcting the distortion of the plotted image.

In an eighth aspect of the invention, the beam position detecting means includes the slit plate and the optical detecting means, and the angle adjusting means is an actuator for turning the slit plate in the scanning direction.

According to the eighth aspect, it is possible to automatically calibrate the angle of the beam position detecting means, so as to enhance the correction accuracy of the distortion of the plotted image without increasing steps of the required processing.

In a ninth aspect of the invention, the slit plate is formed of a glass plate, and the detecting slit is formed by removing a portion, through which the optical beam passes, from a light shielding film formed on the glass plate.

According to the ninth aspect, as the slit plate is formed of a glass plate, the slit plate is less susceptible to errors due to a change in temperature.

In a tenth aspect of the invention, the light shielding film of the ninth aspect includes a chromium film.

According to the tenth aspect, highly precise processing is possible by use of a thin chromium film as the light shielding film, so as to enable detecting the beam position with high precision.

In an eleventh aspect of the present invention, the glass plate of the ninth aspect is a quartz plate.

According to the eleventh aspect, as the slit plate is formed of quartz glass, the slit plate is less susceptible to errors due to a change in temperature.

In a twelfth aspect of the present invention, an exposing method for effecting exposure of a plotted image on an exposure surface by using means which has a plurality of pixels and modulates, per pixel, an optical beam irradiated from a light source, and modulating, per pixel, the plurality of pixels of the modulating means, based on image data, comprises the steps of: detecting exposure point positional information pertaining to an optical beam irradiated on the exposure surface from predetermined pixels to be measured of the modulating means; and calculating a relative positional deviation between positional information pertaining to the pixels to be measured of the modulating means and exposure point positional information pertaining to each of the optical beams projected at the exposure surface from each of the pixels to be measured, detected at the previous step, based on the two positional informations.

In a thirteenth aspect of the present invention, An exposing method for effecting exposure of a plotted image on an exposure surface by using means which has a plurality of pixels and modulates, per pixel, an optical beam irradiated from a light source, and modulating, per pixel, the plurality of pixels of the modulating means based on image data, comprising the step of: detecting exposure point positional information pertaining to an optical beam irradiated on the exposure surface from predetermined pixels to be measured of the modulating means, wherein the exposure point positional information detecting step comprises the steps of: measuring an exposure point of the beam at two or more measurement points which are not aligned in the scanning direction with respect to the exposing head; and detecting, from the exposure point thus measured, an angle with respect to the scanning direction, of means for detecting exposure point positional information pertaining to an optical beam, i.e., beam position detecting means, used in the exposure point positional information detecting step.

Summing up the above descriptions, the exposing device according to the invention can appropriately detect the distortion of the plotted image which is varied with the lapse of time due to factors such as temperature or vibration when the exposure is performed with the beam emitted from the means for selectively modulating a plurality of pixels. Thus, it is possible to produce the effect of the proper correction according to the detected distortion of the plotted image, so as to form an exposure image of a high quality by the highly accurate plotting.

BRIEF DESCRIPTION OF THE DRAWINGS

FIG. 5A is a plan view of the essential parts of the image forming apparatus, with showing a scanning trace of a reflection beam image (an exposure beam) by each of several micro mirrors in a case where a DMD is not inclined, in the image forming apparatus in the preferred embodiment according to the invention.

FIG. 5B is a plan view of the essential parts of the image forming apparatus, with showing the scanning trace of the exposure beam in a case where the DMD is inclined.

FIG. 8 is an explanatory diagram showing the state in which the predetermined number of specific lighting pixels is detected by using a plurality of detecting slits in the image forming apparatus in the preferred embodiment according to the invention.

FIG. 11A is an explanatory diagram showing the state in which the position of the specific lit pixel is detected using the detecting slit in the image forming apparatus in the preferred embodiment according to the invention.

FIG. 11B is a chart illustrating a signal when a photo sensor detects the specific lit pixel.

FIGS. 13A to 13C are views showing an influence on a plotted image by an inclination of the reference plate according to an embodiment of the present invention.

DETAILED DESCRIPTION OF THE INVENTION

A description will be given below of a multi beam exposing device in a preferred embodiment according to the invention with reference to FIGS. 1 to 12.

[Configuration of Image Forming Apparatus]

Figure 1:
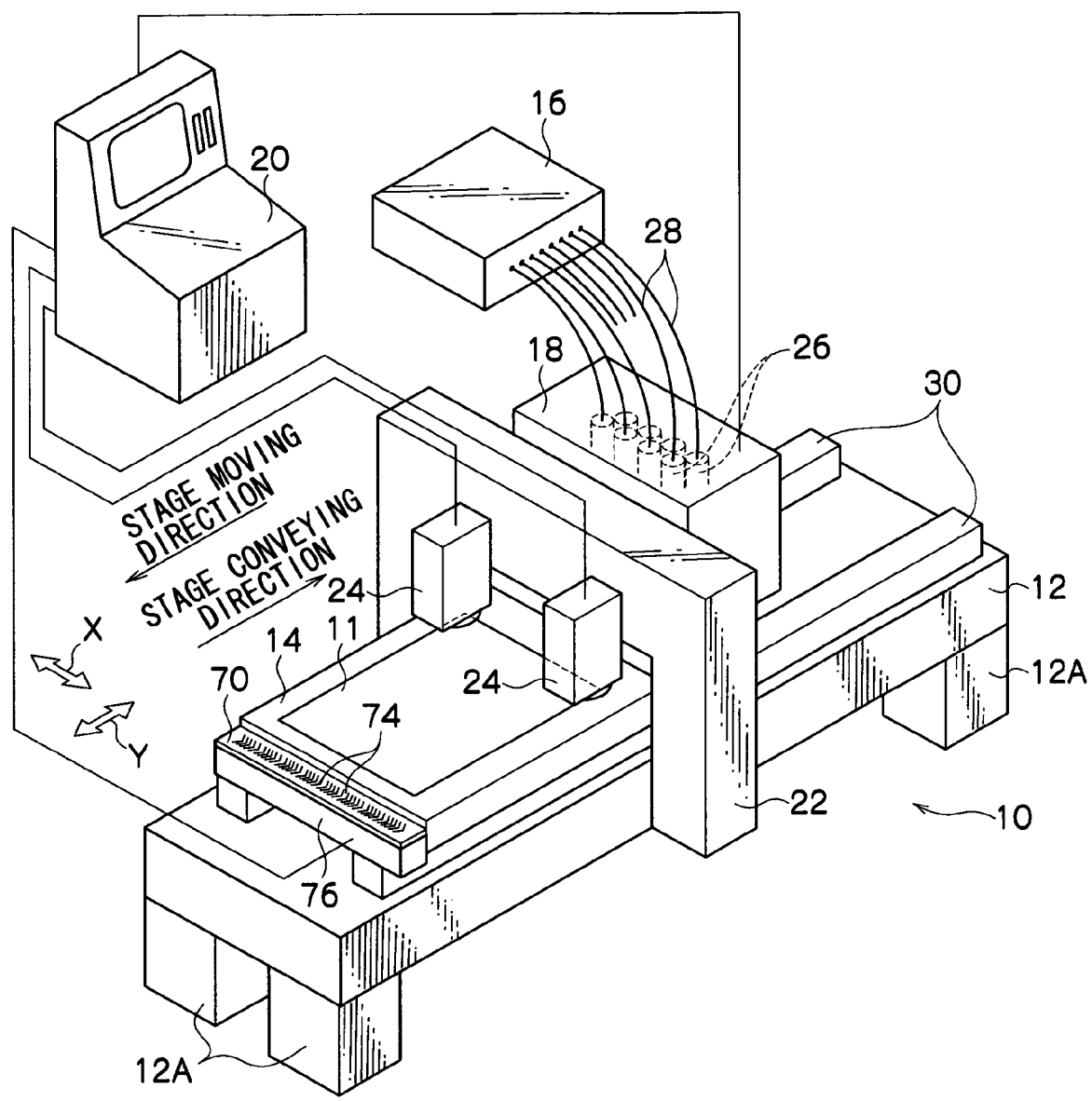
FIG. 1 is a general perspective view schematically showing a multi beam exposing device in an image forming apparatus in a preferred embodiment according to the invention.

As shown in FIG. 1, an image forming apparatus 10 configured as a multi beam exposing device in a preferred embodiment according to the invention is of a so-called flat bed type, comprising: a table 12 supported by four leg members 12A; a moving stage 14 which moves on the table 12 in a direction indicated by an arrow Y in FIG. 1 and has a photosensitive material fixedly mounted thereon, the photosensitive material being that formed on a glass substrate, e.g., a printed circuit board (abbreviated as "a PCB"), a color liquid crystal display (abbreviated as "an LCD") or a plasma display panel (abbreviated as "a PDP"); a light source unit 16 which emits a multi beam including an ultraviolet wavelength region and extending in one direction as a laser beam; an exposing head unit 18 for spatially modulating the multi beam according to the position of the multi beam based on desired image data, and then, irradiating the modulated multi beam as an exposure beam on the photosensitive material which is sensitive in a wavelength region of the multi beam; and a control unit 20 for producing a modulation signal, to be supplied to the exposing head unit 18 according to the movement of the moving stage 14, based on the image data.

In the image forming apparatus 10, the exposing head unit 18 for exposing the photosensitive material to the light beam is arranged above the moving stage 14. The exposing head unit 18 includes a plurality of exposing heads 26. A bundle of optical fibers 28, each of which is drawn from the light source unit 16, is connected to each of the exposing heads 26.

In the image forming apparatus 10, a gate-shaped frame 22 is disposed astride the table 12, and further, a pair of position detecting sensors 24 are fixed onto each side of the gate-shaped frame 22. The position detecting sensor 24 supplies a detection signal to the control unit 20 when it detects the passing of the moving stage 14.

In the image forming apparatus 10, two guides 30 extending along the stage movement direction are placed on the table 12. On the two guides 30 is mounted the moving stage 14 in a manner movable forward and backward. The moving stage 14 is configured in such a manner as to be moved, for example, at a constant speed as relatively low as 40 mm/sec. with respect to a movement of 1,000 mm with a linear motor, not shown.

In the image forming apparatus 10, the photosensitive material (i.e., the substrate) placed on the moving stage 14 is scanned and exposed to the light beam while it is moved with respect to the fixed exposing head unit 18.

Figure 2:
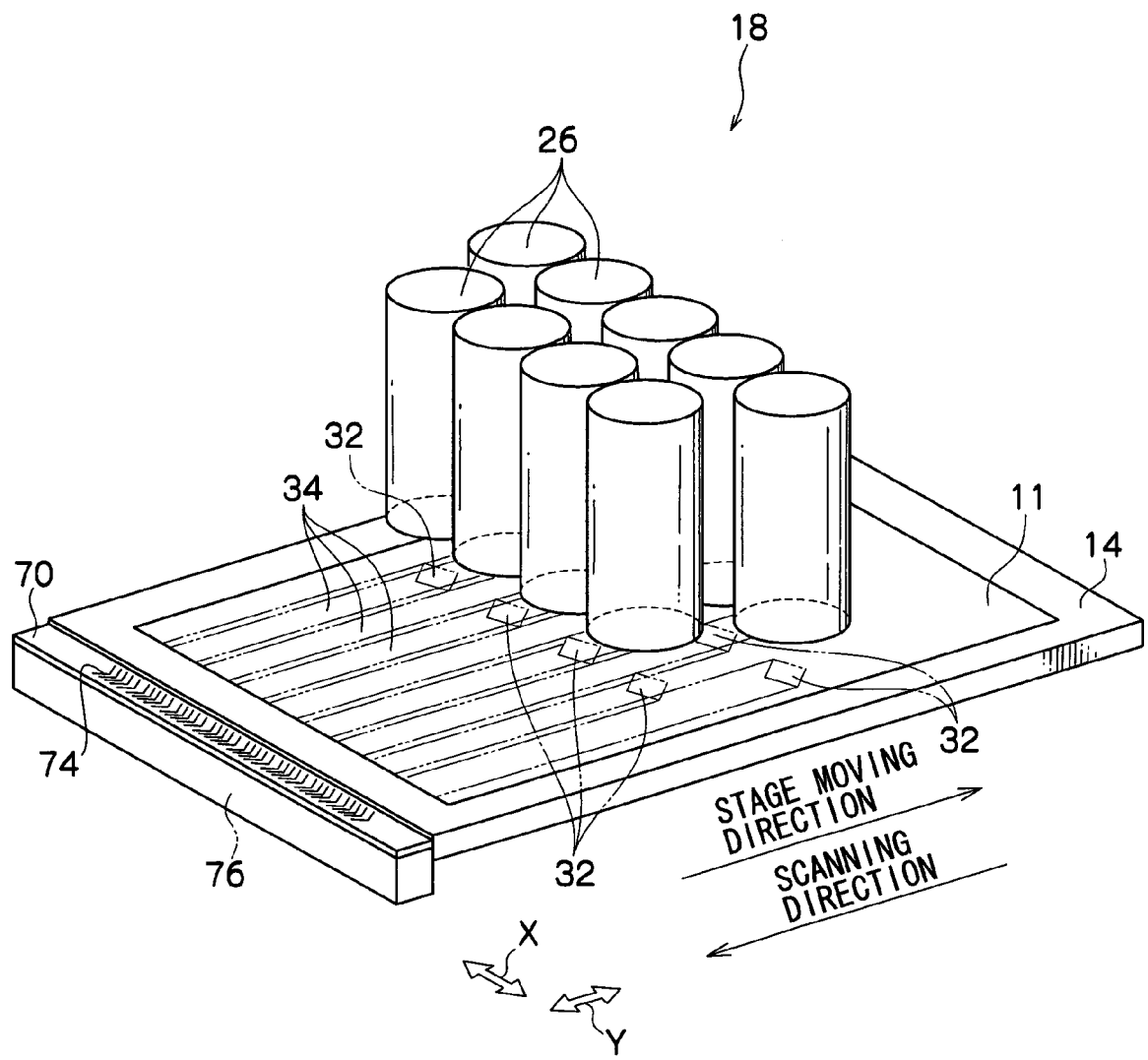
FIG. 2 is a perspective view schematically showing essential parts of an exposing head unit in a state in which a photosensitive material is exposed to a light beam by each of several exposing heads in the exposing head unit disposed in the image forming apparatus in the preferred embodiment according to the invention.

As shown in FIG. 2, the plurality (e.g., eight) of exposing heads 26 are arranged inside of the exposing head unit 18 in a substantial matrix consisting of m columns×n rows (e.g., two columns×four rows).

An exposure area 32 exposed with the exposing head 26 is formed in a rectangular shape having, for example, the short side in the scanning direction. In this case, a band-like exposed region 34 is formed on a photosensitive material 11 per each of the exposing heads 26 according to the movement during scanning and exposure.

Furthermore, as shown in FIG. 2, each of the exposing heads 26 aligned in each of the columns is deviated with a predetermined interval (in multiples of a natural number of the long side of the exposure area) in the alignment direction in such a manner that the band-like exposed regions 34 are arranged without any space between them in a direction perpendicular to the scanning direction. As a consequence, a portion that would otherwise not be exposed between, for example, the exposure area 32 in a first column and the exposure area 32 in a second column can be exposed to the light beam at the exposure area 32 in the second column.

Figure 4:
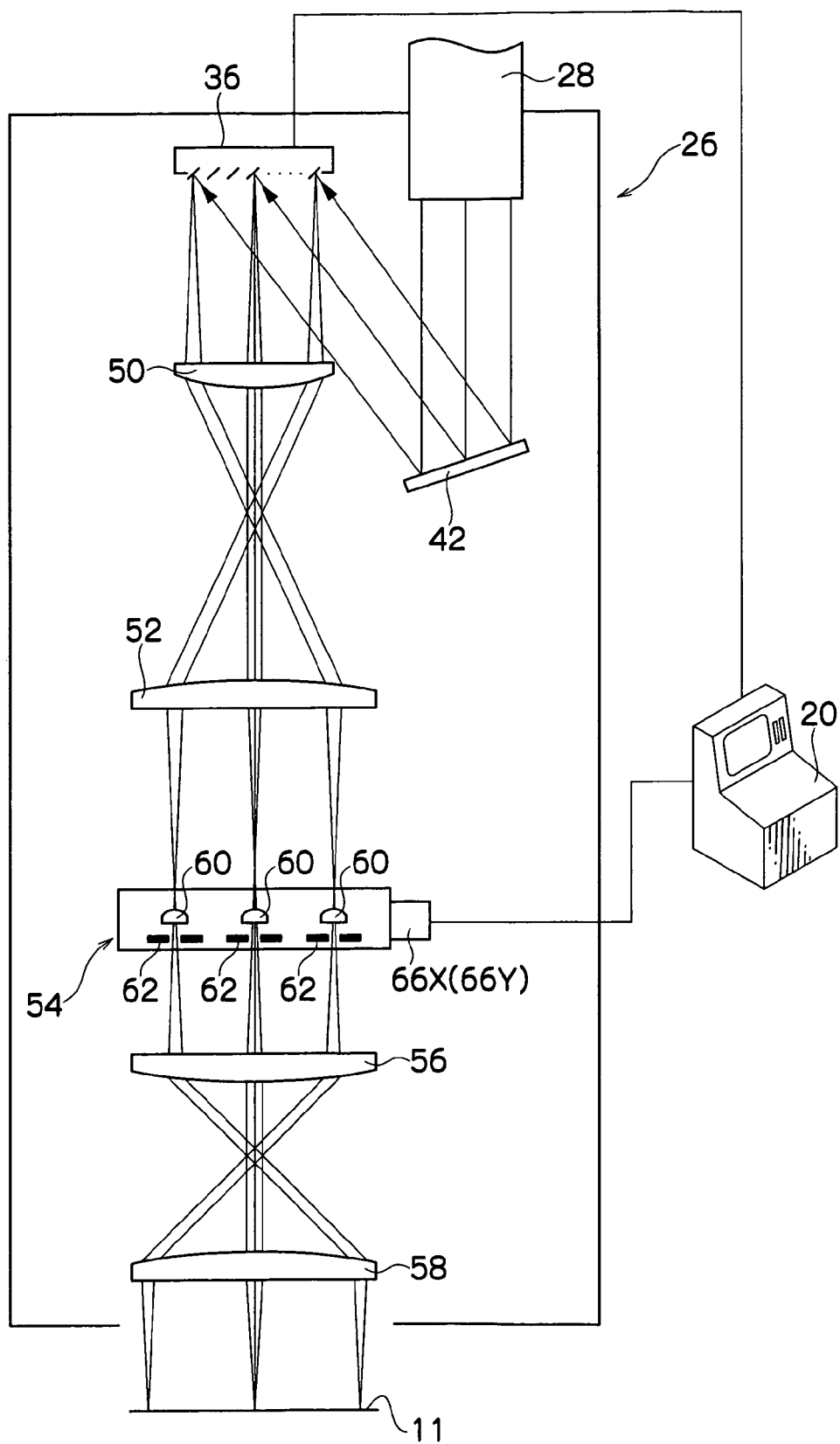
FIG. 4 is a diagram schematically illustrating the configuration of an optical system relevant to the exposing head in the image forming apparatus in the preferred embodiment according to the invention.

As shown in FIG. 4, each of the exposing heads 26 includes a digital micro mirror device (abbreviated as "a DMD") 36 serving as a spatial light modulator for modulating one incident light beam per pixel based on image data. The DMD 36 is connected to the control unit (i.e., the controller) 20 which is provided with a data processor and a mirror drive controller.

The data processor in the control unit 20 produces a control signal for use in driving and controlling each of several micro mirrors disposed inside of a region to be controlled by the DMD 36, based on input image data for each of the exposing heads 26. In addition, the mirror drive controller serving as a DMD controller controls the angle of the reflection surface of each of the micro mirrors in the DMD 36 in each of the exposing heads 26 based on a control signal produced by an image data processor. Control of the angle of the reflection surfaces will be described later in detail.

As shown in FIG. 1, the bundle of optical fibers 28, each of which is drawn from the light source unit 16 serving as a lighting device that emits, as a laser beam, the multi beam extending in one direction and that includes the ultraviolet wavelength region, is connected to the light beam incident side of the DMD 36 in each of the exposing heads 26.

A plurality of coupling modules, each of which couples laser beams emitted from a plurality of semiconductor laser chips to thus input the laser beams into the optical fibers, are housed inside of the light source unit 16, although not shown. The optical fiber extending from each of the coupling modules is a coupling optical fiber for propagating the coupled laser beam. The plurality of optical fibers is bundled into a single unit, and thus, is formed into the bundle of optical fibers 28.

As shown in FIG. 4, a mirror 42 for reflecting the laser beam emitted from the connecting end of the bundle of optical fibers 28 toward the DMD 36 is disposed on the light beam incident side of the DMD 36 in each of the exposing heads 26.

Figure 6:
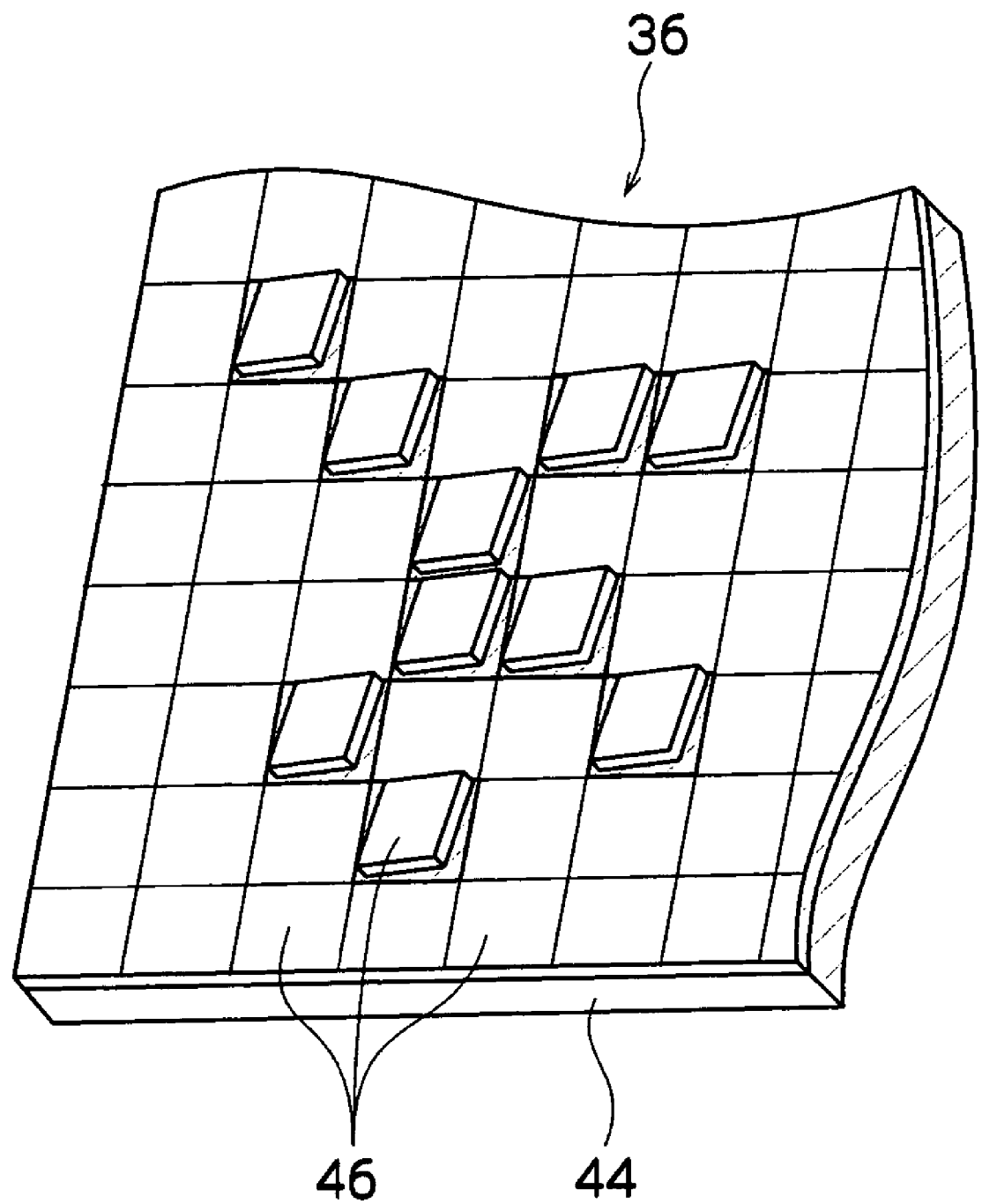
FIG. 6 is an enlarged perspective view showing essential parts in the configuration of the DMD for use in the exposing device in the preferred embodiment according to the invention.

As shown in FIG. 6, the DMD 36 is configured such that tiny mirrors (i.e., micro mirrors) 46 are supported on an SRAM cell (i.e., a memory cell) 44 by struts, that is, as a mirror device in which numerous tiny mirrors (e.g., 600× 800) constituting pixels are arrayed in a grid shape. A micro mirror 46 supported by a strut is mounted at the uppermost portion of each of the pixels. A high reflectivity material such as aluminum is deposited on the micro mirrors 46.

Moreover, the silicon gate CMOS SRAM cell 44, produced on a manufacturing line for normal semiconductor memory, is disposed immediately under the micro mirrors 46 via the struts including a hinge and a yoke, neither shown. As a whole, the SRAM cell 44 is configured in a monolithic (i.e., integral) manner.

Figure 7A:
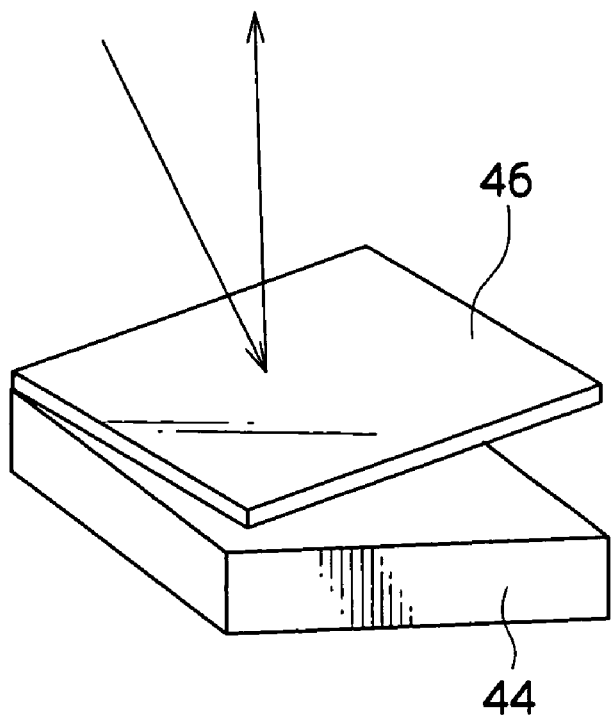
FIG. 7A is an explanatory view showing the operation of the DMD for use in the exposing device in the preferred embodiment according to the invention.
Figure 7B:
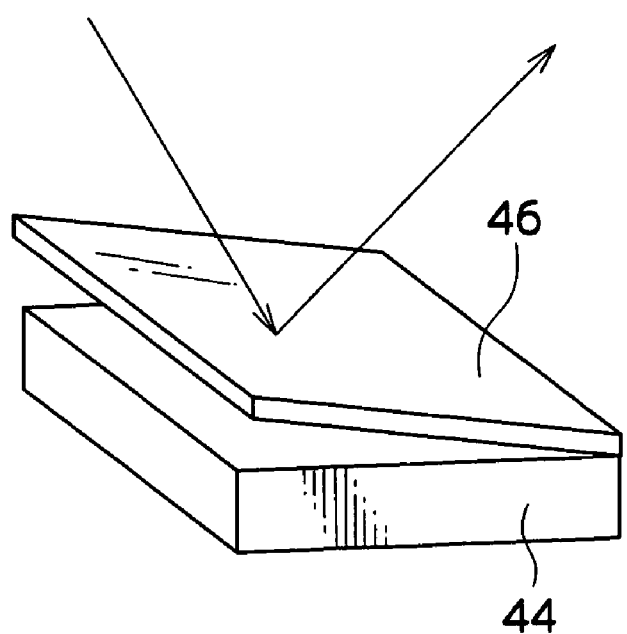
FIG. 7B is another explanatory view showing the operation of the DMD for use in the exposing device in the preferred embodiment according to the invention.
Figure 9:
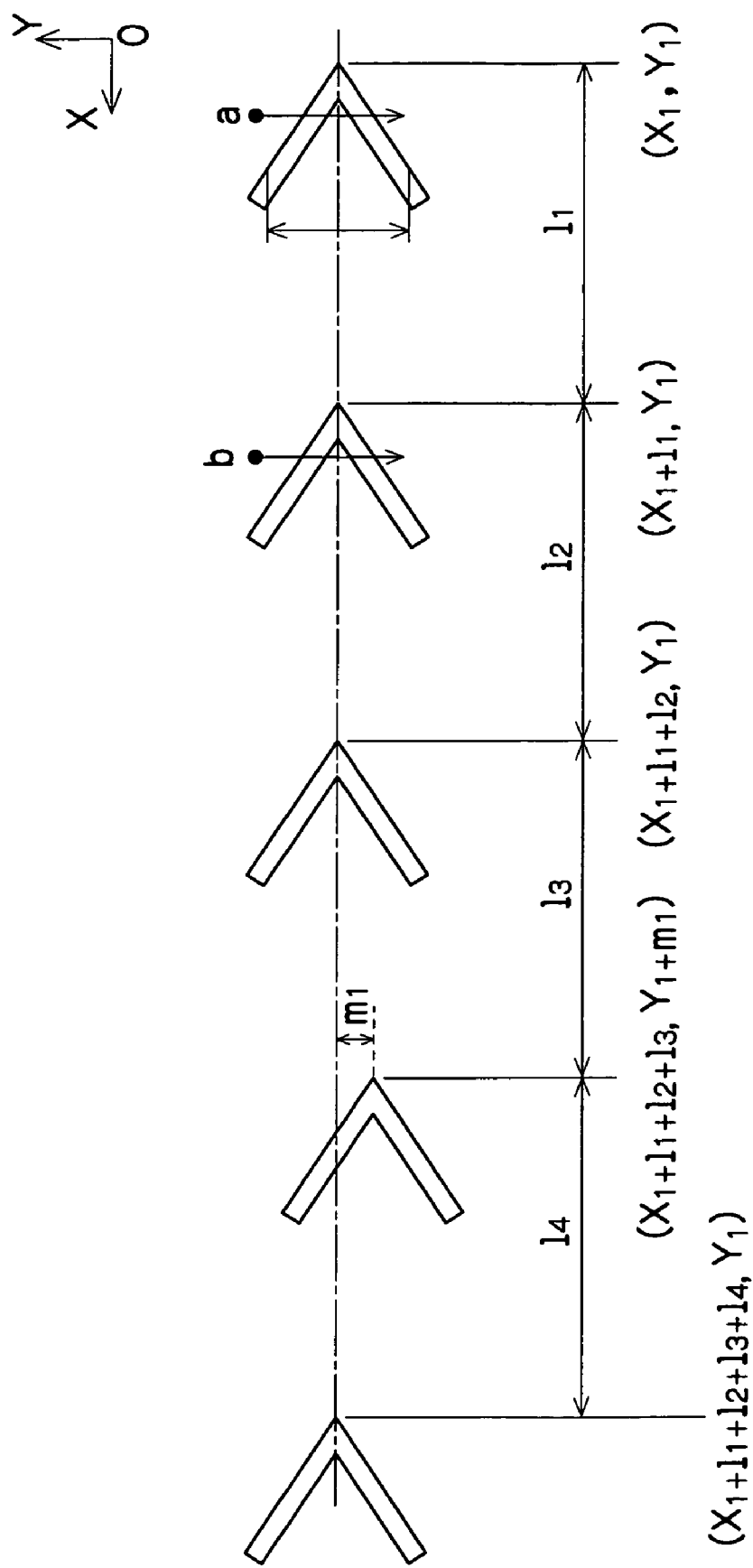
FIG. 9 is a diagram illustrating one example of the relative positional relationship of the plurality of detecting slits formed on a slit plate in the image forming apparatus in the preferred embodiment according to the invention.

When a digital signal is written in the SRAM cell 44 in the DMD 36, the micro mirror 46 supported by the strut is inclined within a range of ±a° (e.g., ±10°) with respect to the side of the substrate on which the DMD 36 is disposed with reference to a diagonal as a center. FIG. 7A shows a state in which a micro mirror 46 is inclined at +a° in an ON state; in contrast, FIG. 7B shows a state in which a micro mirror 46 is inclined at −a° in an OFF state. As a consequence, each of the light beams incident on the DMD 36 is reflected in the inclination direction of each of the micro mirrors 46 by controlling the inclination of the micro mirrors 46 at each of the pixels in the DMD 36 in accordance with an image signal, as shown in FIG. 6.

Incidentally, FIG. 6 shows an enlarged portion of the DMD 36 with one example of a state in which the micro mirrors 46 are controlled at +a° or −a°. The ON/OFF control of each of the micro mirrors 46 is performed by the control unit 20 connected to the DMD 36, and thus, the light beams reflected by the micro mirrors 46 in the ON state are modulated in an exposure state, to then enter into a projection optical system disposed on the light beam emission side of the DMD 36 (see FIG. 4). The light beams reflected by the micro mirrors 46 in the OFF state are modulated in a non-exposure state, to then enter into a light absorber, not shown.

Additionally, it is preferable that the DMD 36 be disposed with a slight inclination such that its short side forms a predetermined angle (e.g., 0.1° to 0.5°) with respect to the scanning direction. FIG. 5A illustrates a scanning trace of a reflection beam image (i.e., an exposure beam) 48 by each of the micro mirrors in a case where the DMD 36 is not inclined; in contrast, FIG. 5B illustrates the scanning trace of the exposure beam 48 in a case where the DMD 36 is inclined.

Numerous groups (e.g., 600 groups) of micro mirror arrays (rows) consisting of numerous micro mirrors 46 (e.g., 800) arrayed in a longitudinal direction (i.e., a columnar direction) are arrayed in a lateral (short-side) direction. As illustrated in FIG. 5B, a pitch P2 of the scanning trace (i.e., a scanning line) of an exposure beam 48 by each of the micro mirrors 46 where there exists inclination of the DMD 36 is narrower than a pitch P1 of a scanning line where there is no inclination of the DMD 36, thereby markedly enhancing resolution of the former. Yet, since the inclination angle of the DMD 36 is minute, the scanning width W2 in the case where the DMD 36 is inclined is substantially equal to the scanning width W1 in the case where the DMD 36 is not inclined.

In addition, substantially one position (i.e., a dot) on the same scanning line is exposed in an overlapping manner (multiple exposure) by different micro mirror arrays. In this manner, the exposure position can be controlled in minute quantities by the multiple exposure, thereby achieving exposure with high accuracy. Moreover, spaces between the plurality of exposing heads arranged in the scanning direction can be continuously connected to each other smoothly by control of the exposure position in minute quantities.

Here, each of the micro mirror arrays can be shifted by a predetermined interval in a direction perpendicular to the scanning direction in a zigzag manner instead of inclining the DMD 36, thereby producing the same effect.

Subsequently, explanation will be given of the projection optical system (i.e., a focusing optical system) disposed on the light beam reflection side of the DMD 36 in the exposing head 26. As shown in FIG. 4, the projection optical system disposed on the light beam reflection side of the DMD 36 in each of the exposing heads 26 is configured such that exposing optical members such as lens systems 50 and 52, a micro lens array 54, and objective lens systems 56 and 58 are disposed in this order from the DMD 36 to the photosensitive material 11, to project a light source image on the photosensitive material 11 mounted on the exposure surface on the light beam reflection side of the DMD 36.

Here, each of the lens systems 50 and 52 is configured as an enlargement optical system. The area of the exposure area 32 (shown in FIG. 2) by beam flux that is reflected by the DMD 36 onto the photosensitive material 11 is enlarged to a required size by enlarging the cross-sectional area of the beam flux to be reflected by the DMD 36.

As shown in FIG. 4, the micro lens array 54 is molded by integrating a plurality of micro lenses 60, which correspond one to one with the micro mirrors 46 of the DMD 36 for reflecting the laser beam irradiated by the light source unit 16 via each of the optical fibers 28. Each of the micro lenses 60 is aligned on the optical axis of each of the laser beams transmitting through the lens systems 50 and 52.

The micro lens array 54 is formed in a rectangular plate. An aperture 62 is arranged integrally with a portion at which each of the micro lenses 60 is formed. The aperture 62 is configured as an aperture disposed in one-to-one correspondence with respect to each of the micro lenses 60.

As shown in FIG. 4, each of the objective lens systems 56 and 58 is configured as, for example, a non-magnifying optical system. The photosensitive material 11 is disposed at the rear focusing positions of the objective lens systems 56 and 58. Here, although each of the lens systems 50 and 52 and the objective lens systems 56 and 58 in the projection optical system is illustrated as a single lens in FIG. 4, they may be a combination of a plurality of lenses (e.g., a convex lens and a concave lens).

The image forming apparatus 10 constituted as described above is provided with a plotted image distortion detector for appropriately detecting distortion inherent in the lens systems 50 and 52 and the objective lens systems 56 and 58 in the projection optical system of the exposing head 26 or distortion of a plotted image varying with the lapse of time due to factors such as temperature or vibration during exposure processing by the exposing head 26.

Figure 3:
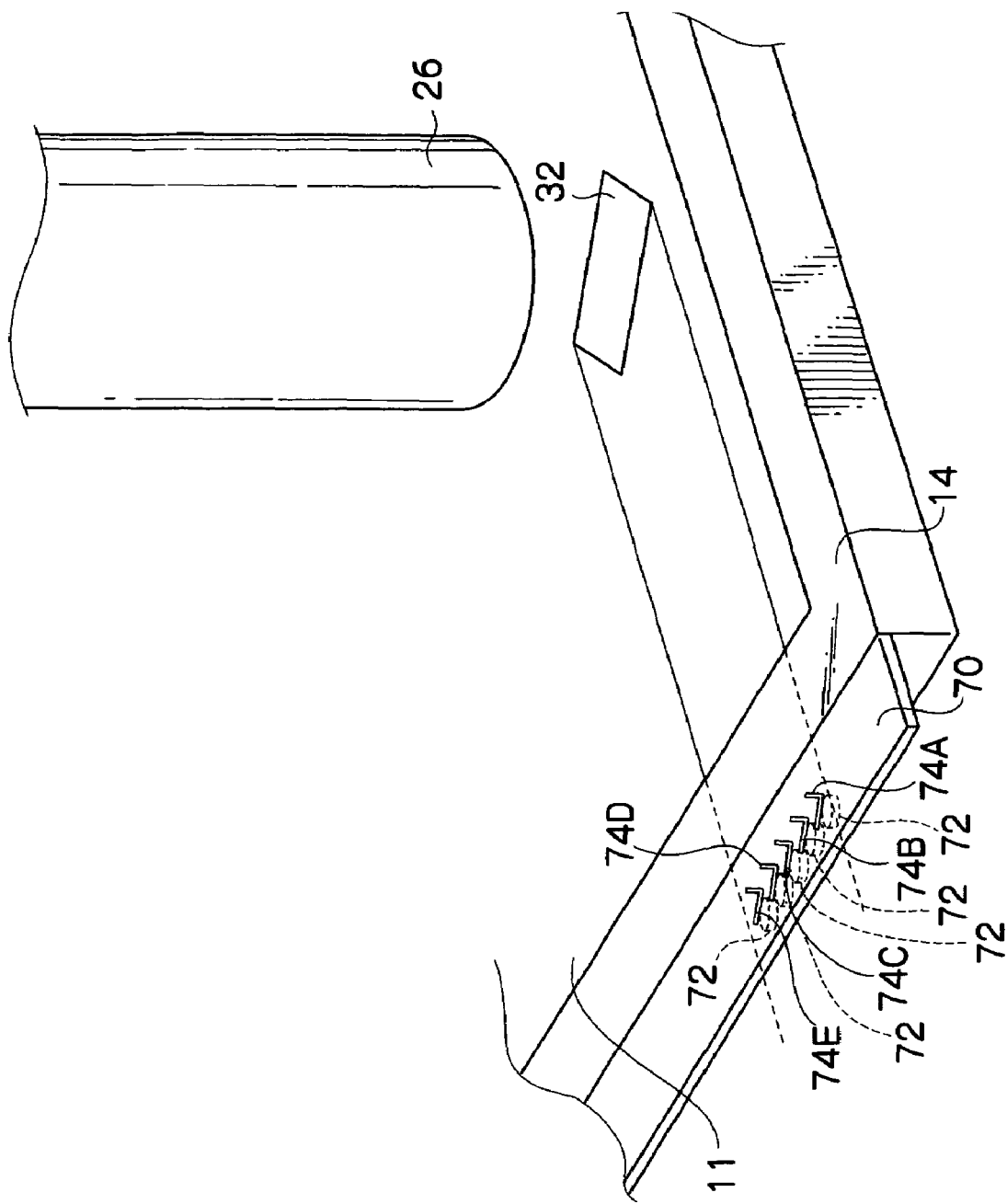
FIG. 3 is an enlarged perspective view schematically showing the essential parts of an exposing head unit in the state in which the photosensitive material is exposed to the light beam from one of the exposing heads in the exposing head unit disposed in the image forming apparatus in the preferred embodiment according to the invention.

A beam position detector for detecting irradiated beam position is disposed upstream in the conveying direction of the moving stage 14 as a part of the plotted image distortion detector in the image forming apparatus 10, as shown in FIGS. 3 and 8.

The beam position detector includes: a slit plate 70 integrally fixed at an end edge, on the upstream side in the conveying direction (i.e., the scanning direction), of the moving stage 14; and photosensors 72 serving as beam detectors arranged on the back side of the slit plate 70 and in correspondence to each of slits.

In the slit plate 70, there are detecting slits 74 formed by forming a beam shielding thin chromium film (e.g., a chromium mask or an emulsion mask) on a rectangular long quartz glass plate having a length equal to the entire widthwise length of the moving stage 14, and by removing a V-shaped portion of the chromium film opening in the X-axis direction so as to allow laser beams to pass through, at predetermined plural positions of the chromium film by etching. The etching process includes the steps of masking, for example, the chromium film, patterning the slit, and eluding a slit portion of the chromium film with an etchant.

The slit plate 70 configured as described above is made of quartz glass, so that error caused by variations in temperature does not easily occur, and further, beam position can be detected with high accuracy by utilizing the beam-shielding thin chromium film.

As illustrated in FIGS. 8 and 11A, the V-shaped detecting slit 74 includes a linear first slit 74a having a predetermined length and being positioned upstream in the conveying direction, and a linear second slit 74b having a predetermined length and being positioned downstream in the conveying direction, and is formed by connecting the first and second slits at one end of each of the first and second slits at right angles. In other words, the first slit 74a and the second slit 74b are perpendicular to each other at right angles, and they are configured such that the first slit 74a is formed at 135° with respect to the Y axis (i.e., the traveling direction) while the second slit 74b is formed at 45°. In the present preferred embodiment, the scanning direction is taken on the Y axis; in contrast, a direction perpendicular to the scanning direction (i.e., the array direction of the exposing heads 26) is taken on the X axis.

Although FIGS. 8 and 11A illustrate that the first slit 74a and the second slit 74b in the detecting slit 74 are formed at 45° with respect to the scanning direction, the angle with respect to the scanning direction may be arbitrarily set as long as the first slit 74a and the second slit 74b are simultaneously inclined with respect to the pixel array in the exposing head 26 and with respect to the scanning direction, that is, the stage movement direction (i.e., the angle with respect to the scanning direction may be arbitrarily set as long as the first slit 74a and the second slit 74b are not parallel to each other). Otherwise, a diffraction grating may be used in place of the detecting slit 74.

The photosensors 72 (which may be a CCD, a CMOS or a photodetector) for detecting the light beams from the exposing head 26 are disposed at predetermined positions immediately under each of the detecting slits 74.

In the above-described image forming apparatus 10, the control unit 20 serving as the controller is provided with the arrangement of an electric system, which is a part of the distortion detector.

The control unit 20 includes an instruction input portion having switches, by which a user inputs commands, a CPU serving as a controller used as a section of a distortion calculator, not shown, and a memory. The controller is configured so as to freely drive and control each of the micro mirrors 46 in the DMD 36. The controller produces an appropriate control signal by subjecting image data to distortion correction processing based on a result detected by the beam position detector, to thus control the DMD 36, and further, drives and controls the moving stage 14 having the photosensitive material 11 mounted thereon in the scanning direction. Moreover, the controller transmits a detection signal output from each of the photosensors 72 and, further, controls various kinds of devices relevant to the entire operation of exposure processing in the image forming apparatus 10, such as the light source unit 16 required for the exposure processing in the image forming apparatus 10.

Next, a description will be given of the beam position detector that makes use of the detecting slit 74 in the plotted image distortion detector disposed in the image forming apparatus 10.

First of all, description will be given of the means for specifying, by the use of a detecting slit 74 in the image forming apparatus 10, a position actually irradiated on the exposure surface when a single specific pixel Z1 as a pixel to be measured is lighted.

The controller in this case moves the moving stage 14, and then, positions a predetermined detecting slit 74 for a predetermined exposing head 26 in the slit plate 70 under the exposing head unit 18.

Next, the controller executes control to turn on (light) only the specific pixel Z1 in the predetermined DMD 36.

Moreover, the controller executes control to move the moving stage 14 in such a manner that the detecting slit 74 is located at a required position (e.g., a position to become an origin) on the exposure area 32, as indicated by a solid line in FIG. 1A. At this time, the controller recognizes an intersection between the first slit 74a and the second slit 74b as (X0, Y0), and stores this in the memory. Here, a rotation direction counterclockwise on the Y axis is referred to as a positive angle in FIG. 11A.

Subsequently, as illustrated in FIG. 11A, the controller executes control to move the moving stage 14, so as to start the rightward movement of the detecting slit 74 along the Y axis in FIG. 11A. Thereafter, the controller stops the moving stage 14 at a position indicated by the phantom line on the right in FIG. 11A when it is detected that the photosensor 72 has detected the light beam from the specific lighting pixel Z1 through the first slit 74a, as illustrated in FIG. 1B. The controller here recognizes the intersection between the first slit 74a and the second slit 74b as (X0, Y11), and stores this in the memory.

Subsequently, the controller executes control to move the moving stage 14, so as to start the leftward movement of the detecting slit 74 along the Y axis in FIG. 11A. Thereafter, the controller stops the moving stage 14 at a position indicated by the imaginary line on the left in FIG. 11A when it is detected that the photosensor 72 has detected the light beam from the specific lighting pixel Z1 through the second slit 74b, as illustrated in FIG. 11B. The controller here recognizes the intersection between the first slit 74a and the second slit 74b as (X0, Y12), and stores this in the memory.

Next, the controller reads the coordinates (X0, Y11) and (X0, Y12) stored in the memory, and obtains the coordinates of the specific pixel Z1, and an actual position is specified by performing the following calculation. Here, if the coordinates of the specific pixel Z1 are (X1, Y1), then $X1=X0+(Y11-Y12)/2$ and $Y1=(Y11+Y12)/2$.

Here, as described above, in the case of the use of the detecting slit 74 having the second slit 74b perpendicular to the first slit 74a in combination with the photosensor 72, the photosensor 72 is adapted to detect only the light beam passing through the first slit 74a or the second slit 74b within a predetermined range. Consequently, the photosensor 72 need not be specially configured in a fine and special structure for detecting the light intensity only within a narrow range corresponding to the first slit 74a or the second slit 74b, and therefore, it may be an inexpensive photosensor which is commercially available.

Next, description will be given of the means for detecting distortion of a plotted image at the exposure area (i.e., the entire exposure region) 32, at which an image can be projected on the exposure surface by the single exposing head 26, in the image forming apparatus 10.

In order to detect distortion at the exposure area 32 representing the entire exposure region, the image forming apparatus 10 is configured such that the position of the single exposure area 32 is detected by the plurality of detecting slits 74, which is five in the present preferred embodiment, at the same time, as illustrated in FIG. 3.

Accordingly, a plurality of pixels to be measured, which are dispersively plotted evenly within the exposure area to be measured, are set within the exposure area 32 to be detected by the single exposing head 26. The pixels are grouped in five units in the present preferred embodiment. The plurality of pixels to be measured are arranged symmetrically with respect to the center of the exposure area 32. At the exposure area 32 illustrated in FIG. 8, two pairs of groups consisting of the pixels Za1, Za2 and Za3 and Zb1, Zb2 and Zb3 to be measured and two pairs of groups consisting of the pixels Zd1, Zd2 and Zd3 and Ze1, Ze2 and Ze3 to be measured are arranged in a lateral direction symmetrically with respect to the pixels Zc1, Zc2 and Zc3 to be measured in one group (here, one group consists of three pixels to be measured) arranged at the center in the longitudinal direction of the exposure area 32.

Moreover, as illustrated in FIG. 8, the five detecting slits 74A, 74B, 74C, 74D, and 75E are arranged at corresponding positions on the slit plate 70 in such a manner as to detect each group of pixels to be measured.

In addition, the relationship of the relative coordinate positions of the intersections between the first slits 74a and the second slits 74b are determined to facilitate calculation when adjusting a machining error among the five detecting slits 74A, 74B, 74C, 74D and 75E previously formed on the slit plate 70. In the slit plate 70 illustrated in FIG. 9, as an example, in reference to the coordinates (X1, Y1) of the first detecting slit 74A, the coordinates of the second detecting slit 74B are (X1+l1, Y1); the coordinates of the third detecting slit 74C are (X1+l1+l2, Y1); the coordinates of the fourth detecting slit 74D are (X1+l1+l2+l3, Y1+m1); and the coordinates of the fifth detecting slit 74E are (X1+l1+l2+l3+l4, Y1).

In the case where the controller detects the distortion of the exposure area 32 based on the above-described condition, the controller controls the DMD 36; turns on the predetermined groups of pixels to be measured (Za1, Za2, Za3, Zb1, Zb2, Zb3, Zc1, Zc2, Zc3, Zd1, Zd2, Zd3, Ze1, Ze2 and Ze3); moves the moving stage 14 having the slit plate 70 mounted thereon immediately under each of the exposing heads 26; and determines the coordinates of each of the pixels to be measured by the use of the corresponding detecting slits 74A, 74B, 74C, 74D and 75E. At this time, the predetermined groups of pixels to be measured may be independently turned on, or all of the predetermined groups of pixels to be measured may be detected as the ON state.

Figure 10:
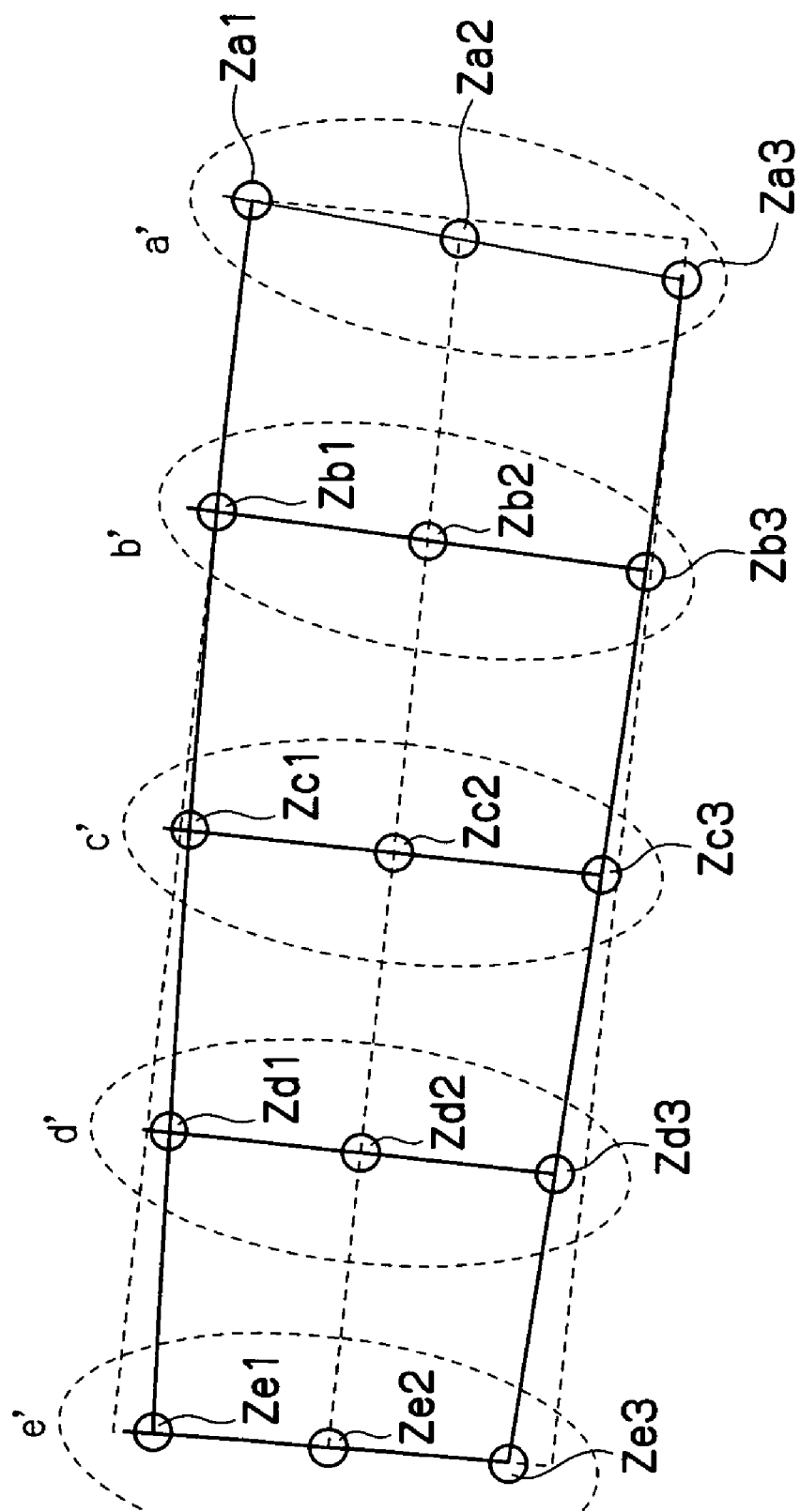
FIG. 10 is a diagram illustrating distortion (i.e., a distorted state) of a plotted image detected by a means for detecting plotted image distortion in the image forming apparatus in the preferred embodiment according to the invention.

Subsequently, the controller calculates the relative positional deviations between positional information pertaining to the reflection surface of a predetermined micro mirror 46 corresponding to each of the pixels to be measured in the DMD 36 and exposure point positional information pertaining to a predetermined light beam projected on the exposure surface (i.e., the exposure area 32) from a predetermined micro mirror 46 detected by the use of the detecting slit 74, based on these two positional informations, thereby determining the distortion (i.e., the distorted state) of the plotted image within the exposure area 32, as illustrated in FIG. 10.

FIGS. 12A to 12F show distortion of a plotted image in one head, a method of correcting the distortion, and an influence on the image by the distortion.

Figure 12A:
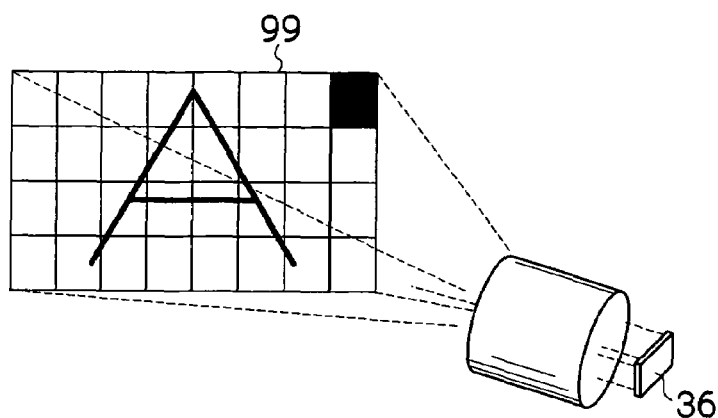
FIGS. 12A to 12F are explanatory views illustrating an example of correction of distortion in a plotted image, which distortion has been detected with the means for calculating distortion in the plotted image provided in the image forming device according to an embodiment of the present invention.
Figure 12B:
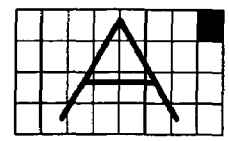

As shown in FIG. 12A, when there is no distortion in the optical system and the photosensitive material, the image data inputted to DMD 36 is not corrected, in particular, as shown in FIG. 12B, and directly outputted onto the photosensitive material 11. An ideal image is plotted, as shown in FIG. 12A.

Figure 12C:
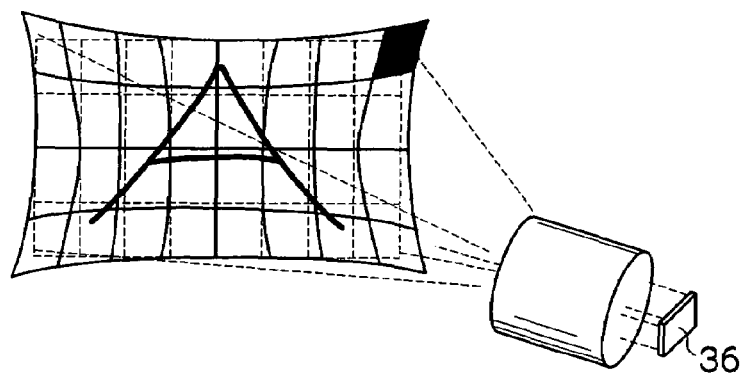
Figure 12D:
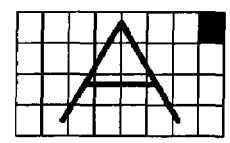
Figure 12E:
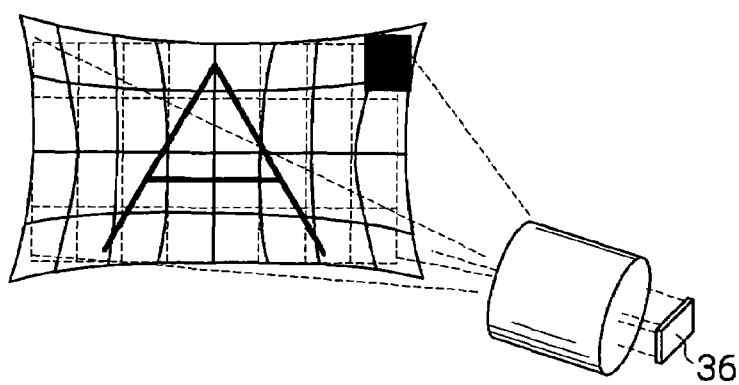

However, in a case in which there is generated, in an image in one head, distortion of the plotted image which is varied due to factors such as temperature or vibration when the exposure is performed with the emitted beam, if an uncorrected image is inputted to DMD 36 as it is, the image 99 exposed onto the exposure area 32 will be deformed as shown in FIG. 12C. In this case, the image must be corrected.

Figure 12F:
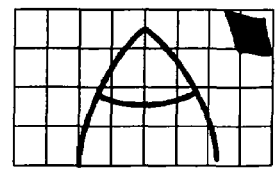

Therefore, as shown in FIG. 12F, the image data inputted to DMD 36 is corrected, the magnitude of distortion in the plotted image is calculated with the distortion calculating means, based on the positional information on the image outputted onto the photosensitive material 11, which image or positional information is detected with the positional deviation calculating means. By appropriately correcting the image in accordance with the distortion of the plotted image thus detected, a correct image 99' without having distortion can eventually be obtained.

In the image forming apparatus 10, the image data is properly corrected by subjecting the image data or exposure point coordinate data applicable to the image forming apparatus 10 to correction processing (e.g., a process in which an actual measurement value (a value calculated based on the distortion) is used as the exposure point coordinate data when, for example, correcting the conventional distortion), based on the distortion (i.e., the distorted state) of the plotted image detected by the above-described distortion detector for the plotted image, thereby controlling the DMD 36, followed by exposure processing with respect to a plotted image pattern with high accuracy, so as to enhance the quality of processing involving pattern exposure of the photosensitive material.

Incidentally, although a description has been given of the above-described image forming apparatus 10 in which the plurality of detecting slits 74A, 74B, 74C, 74D, and 75E are formed on the slit plate 70 and the photosensors 72 are disposed in a manner corresponding to the detecting slits, respectively, the image forming apparatus may be configured such that the combination of a single detecting slit 74 with a single photosensor 72 is moved in the X-axis direction with respect to the moving stage 14, thereby detecting the position of each of the groups consisting of the pixels to be measured.

In this case, movement positional information pertaining to the movement in the X-axis direction, and positional information pertaining to the exposure point at which the exposure surface is actually irradiated when lighting the pixel to be measured, are calculated with a combination of the single detecting slit 74 with the single photosensor 72, thus determining the distortion (i.e., the distorted state) of the plotted image.

[Operation of the Image Forming Apparatus]

Next, description will be given on operation of the image forming apparatus 10 configured as described above.

The light source unit 16 serving as a fiber array light source in the image forming apparatus 10 collimates laser beams such as of ultraviolet rays emitted from each of several laser light emitting elements in a light scattering state, into collimated light beams, and focuses the light beams with a focusing lens; propagates the light beams inside of optical fiber from the incident end of a core of multi-mode optical fiber; and couples the light beams into a single laser beam in a laser emitter and then emits the light beam from the optical fiber 28 connected to the emission end of the multi mode optical fiber, although not shown.

In the image forming apparatus 10, the image data in accordance with the exposure pattern is input into the control unit 20 connected to the DMD 36, and then temporarily stored in the memory housed inside of the control unit 20. The image data is of a type in which the density of each of the pixels composing the image is expressed in a binary manner (i.e., the existence or not of the recording of a dot). The controller appropriately corrects the image data based on the distortion (i.e., the distorted state) of the plotted image detected by the above-described distortion detector for the plotted image.

The moving stage 14 having the photosensitive material 11 attached thereto by vacuum is moved at a constant speed downstream from upstream in the conveying direction along the guide 30 by a drive device, not shown. Upon detection of the tip of the photosensitive material 11 by the position detecting sensor 24 fixed to the gate-shaped frame 22 when the moving stage 14 is moved under the gate-shaped frame 22, the image data corrected based on the distortion of the plotted image detected by the distortion detector for the plotted image stored in the memory is sequentially read in units of several lines, and then, the control signal is produced by each of the exposing heads 26 based on the image data read by the controller serving as a data processor.

Here, when the control signal is produced by each of the exposing heads 26 based on non-corrected image data read by the controller, the image data may be corrected based on the magnitude of the distortion (i.e., the distorted state) of the plotted image detected by the above-described distortion detector for the plotted image.

Thereafter, each of the micro mirrors in the spatial light modulator (i.e., the DMD) 36 is controlled so as to be turned on or off based on the produced control signal per each of the exposing heads 26.

With the irradiation of laser light from the light source unit 16 to the spatial light modulator (i.e., the DMD) 36, the laser light reflected in an ON state of the micro mirror in the DMD 36 is focused at an exposure position for the appropriately corrected plotted image. In this manner, laser light emitted from the light source unit 16 is turned on or off per pixel, followed by exposure processing with respect to the photosensitive material 11.

Additionally, the photosensitive material 11 is moved at the constant speed together with the moving stage 14, so that the photosensitive material 11 is scanned in a direction reverse to the stage movement direction by the exposing head unit 18, thereby forming the band-like exposed region 34 (as shown in FIG. 2) per each of the exposing heads 26.

When the rear end of the photosensitive material 11 is detected by the position detecting sensor 24 after the photosensitive material 11 is scanned by the exposing head unit 18, the moving stage 14 is returned to the origin located most upstream in the conveying direction along the guide 30 by the drive device, not shown. Then, the moving stage 14 is again moved downstream from upstream in the conveying direction along the guide 30 at the constant speed.

Although a DMD is used as the spatial light modulator in the exposing head 26 in the image forming apparatus 10 of the present preferred embodiment, it may be replaced with a spatial light modulator of a micro electromechanical system (MEMS) type (e.g., a Special Light Modulator (SLM)), or a spatial light modulator other than the MEMS type such as an optical element for modulating transmitting light by an electrooptical effect (i.e., a PLZT element) or a liquid crystal light beam shutter (i.e., an FLC).

MEMS is a generic name for a micro-system, in which a micro-sized sensor, actuator, and control circuit are integrated by a micro-machining technique based on an IC producing process. A spatial light modulator of MEMS type represents a spatial light modulator driven with an electromechanical operation by utilizing static electricity.

The image forming apparatus 10 of the present preferred embodiment may be configured such that the spatial light modulator (the DMD) 36 for use in the exposing head 26 may be replaced with a means for selectively turning on or off a plurality of pixels. The means for selectively turning on or off the plurality of pixels is constituted of, for example, a laser light source capable of selectively turning on or off a laser beam corresponding to each of the plurality of pixels and emitting the laser beam, or a laser light source capable of selectively turning on or off a tiny laser-emitting surface of a surface emitting laser element, the element being formed by disposing each of the tiny laser-emitting surfaces in a manner corresponding to each of the pixels.

In a case in which the slit plate 70 is inclined by an angle θ with respect to the direction orthogonal to the scanning direction, as shown in FIG. 13A, with the lapse of time or the like, an "error" with respect to the image 99 exposed onto the exposure area 32 is mistakenly detected due to the inclination of the slit plate 70. As a result, if an uncorrected image is inputted into DMD 36 as it is, the image 99 will be deformed as indicated with the solid line.

Thus, it is necessary to measure the angle θ formed by the slit plate 70 with respect to a direction orthogonal to the scanning direction or the angle "θ scale", to calibrate the inclination of the slit plate 70.

Figure 14:
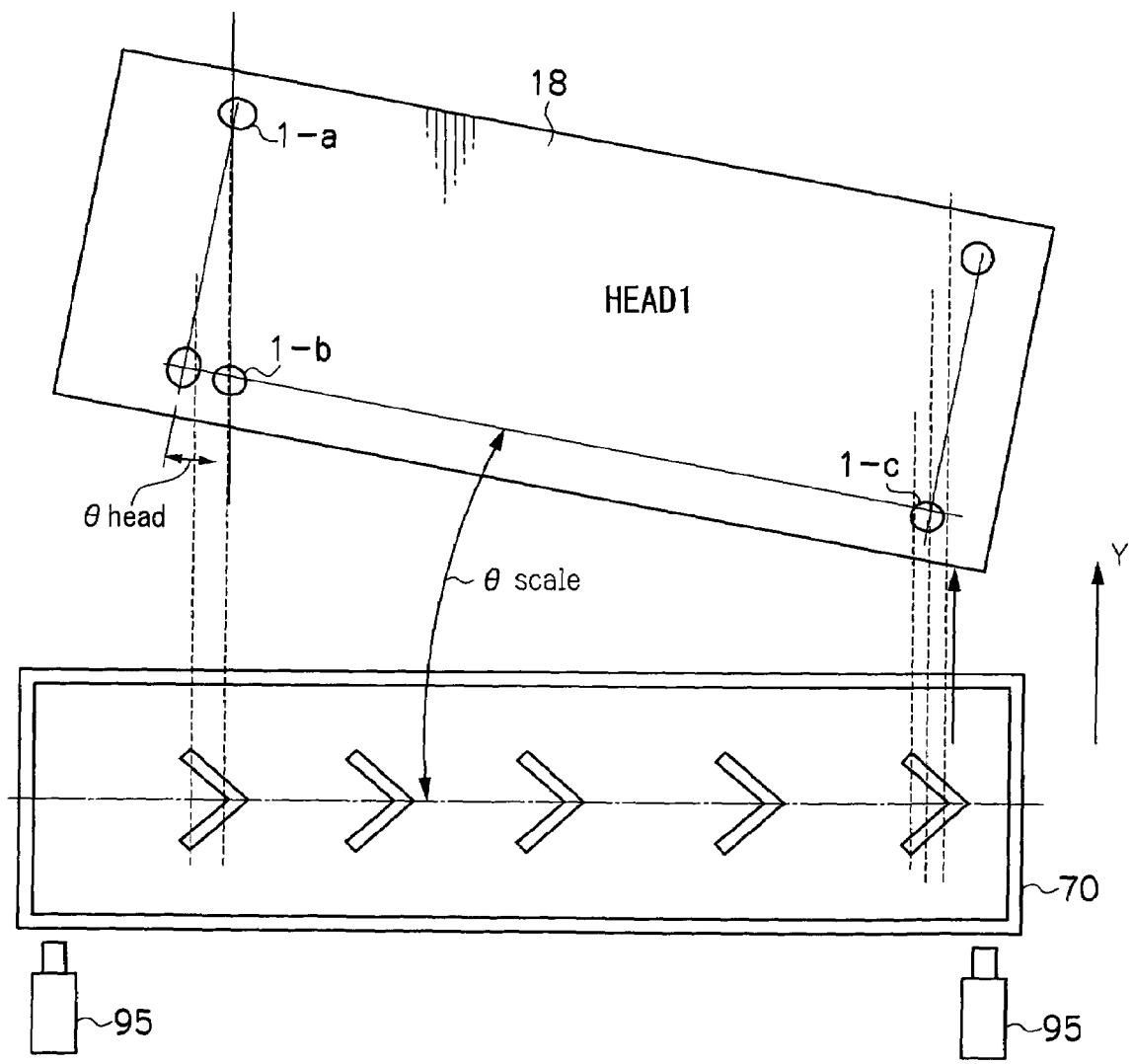
FIG. 14 is a diagram illustrating a method for measuring the angle between a reference plate and the exposing head in the preferred embodiment according to the invention.

FIG. 14 illustrates an angle measuring method of the slit plate and the exposing head.

As illustrated in FIG. 14, each of the exposing heads 26 can turn on or off the exposure per pixel.

In other words, there is provided the digital micro mirror device (DMD) 36 as the spatial light modulator for modulating each of the incident light beams per pixel in accordance with the image data. With the irradiation of the laser light emitted from the exposing head 26 onto the DMD 36, laser light reflected in the ON state of the micro mirror in the DMD 36 is focused on the exposure surface of the photosensitive material 11 by the lens system. The laser light is turned on or off per pixel, and thus, the photosensitive material 11 is exposed to the laser light in units of substantially the same number of pixels (i.e., the exposure areas) as the number of pixels used in the DMD 36.

The slit plate 70 provided with the detecting slit 74 for detecting the exposure position with the laser beam is disposed as a exposure beam position detector, and further, at least two detecting slits 74 are formed at one exposing head unit 18.

First of all, pixels 1-a, 1-b and 1-c are lighted in sequence in a head 1 illustrated in FIG. 14. Here, an angle θhead of the head 1 with respect to the scanning direction (i.e., in the Y direction) can be calculated by determining the positions (i.e., the coordinates), on the head 1, of the pixels 1-a and 1-b aligned in the scanning direction. Next, an angle θscale of the slit plate 70 with respect to the head 1 can be calculated by determining the positions (i.e., the coordinates), on the head 1, of the pixels 1-b and 1-c aligned on the same line (on the head 1).

Finally, the angle of the slit plate 70 is adjusted by an angle adjustor 95 in such a manner that the above-described two angles θhead and θscale become equal to each other.

With the above-described adjustment, the angle of the slit plate 70 can be correctly adjusted in a vertical direction with respect to the scanning direction (i.e., the Y direction), so that the pixel positions inside of the plurality of exposing heads 26 can be measured in an accurate coordinate system, thereby achieving exposure as a result of accurate distortion correction of the exposure image.

That is to say, since the angle between the head 1 and the scanning direction and the angle between the head 1 and the slit plate 70 can be detected, the angle between the scanning direction and the slit plate 70 can be detected and calibrated based on the above-described two angles.

With the above-described configuration, the position of the slit plate 70 as a coordinate reference defined inside of the image forming apparatus 10 can be corrected by itself with high accuracy. As a consequence, if variations occurring with the lapse of time exist inside of the image forming apparatus 10, such as, for example, if the scanning direction of the moving stage 14 is varied or the fixing angle of the slit plate 70 is varied in the scanning direction, calibration can be achieved with merely the inner adjustment of the apparatus without any need of a highly accurate measuring device for measuring the scanning direction. Thus, the reliability of the entire image forming apparatus 10 is enhanced even with the lapse of time.

Further, a correct image 99 without having distortion, which distortion is mistakenly detected due to the slant of the slit plane 70, can be obtained by, alternative to the method of mechanically calibrating the angle of the slit plate 70, a method of correcting the image data inputted into DMD 36 in accordance with the angle θ thus detected, and making necessary correction of the image itself outputted onto the photosensitive material 11.

Incidentally, the multi beam exposing device according to the invention is not limited to the above-described preferred embodiment, and therefore, it is to be understood that multi beam exposing devices according to the invention can be implemented with other various configurations without departing from the scope of the invention.

What is claimed is:

1. An exposing device including modulating means which has a plurality of pixels and modulates, per pixel, an optical beam irradiated from a light source, for exposing a plotted image on an exposure surface by modulating, per pixel, the plurality of pixels of the modulating means based on image data, the multi beam exposing device comprising:
   beam position detecting means for detecting exposure point positional information pertaining to an optical beam irradiated on the exposure surface from predetermined pixels to be measured of the modulating means; and
   positional deviation calculating means for calculating a relative positional deviation between positional information pertaining to the pixels to be measured of the modulating means and exposure point positional information pertaining to each of the optical beams projected at the exposure surface from each of the pixels to be measured detected by the use of the beam position detecting means, based on the two positional informations.

2. The exposing device according to claim 1, further comprising distortion calculating means for calculating a distortion of a plotted image based on the relative positional deviation calculated by the positional deviation calculating means.

3. The exposing device according to claim 2, further comprising image data correcting means for correcting image data based on the distortion of the plotted image calculated by the distortion calculating means.

4. The exposing device according to claim 1, wherein the beam position detecting means includes:
   a slit plate disposed at an end of a stage, on which a photosensitive material to be disposed on an exposure surface is mounted and which moves in a scanning direction;
   a detecting slit formed on the slit plate and configured in such a shape that a first linear slit having a predetermined length and a second linear slit having a predetermined length are arranged non-parallel to each other; and
   optical detecting means for receiving an optical beam passing through the detecting slit.

5. The exposing device according to claim 4, wherein the slit plate is formed of a glass plate, and the detecting slit is formed by removing a portion, through which the optical beam passes, from a light shielding film formed on the glass plate.

6. The exposing device according to claim 5, wherein the light shielding film includes a chromium film.

7. The exposing device according to claim 5, wherein the glass plate is a quartz glass plate.

8. The exposing device according to claim 1, further comprising an angle adjusting means for mechanically adjusting an angle, with respect to the scanning direction, of the beam position detecting means.

9. The exposing device according to claim 1, wherein the beam position detecting means includes a slit plate and an optical detecting means, and the angle adjusting means is an actuator for rotating the slit plate in the scanning direction.

10. The exposure device according to claim 1, wherein the beam position detecting means includes:
    a slit plane which rotates in a scanning direction.

11. The exposing device according to claim 1, wherein the modulating means is configured with a plurality of micro mirrors which constitute the plurality of the pixels of the modulating means.

12. The exposing device according to claim 11, wherein the beam position detecting means detects the exposure point positional information based on a position of the micro mirrors corresponding to the predetermined pixels to be measured of the modulating means.

13. The exposing device according to claim 11, wherein each of the micro mirrors among the plurality of micro mirrors, supported by a strut, is mounted at an uppermost portion of each of the plurality of pixels of the modulating means.

14. The exposing device according to claim 1, wherein the positional deviation calculating means calculates the positional information pertaining to the pixels to be measured of the modulating means by arranging the predetermined pixels to be measured of the modulating means to correspond to detecting slits on a slit plane of the beam position detecting means.

15. The exposing device according to claim 14, wherein the plurality of pixels to be measured of the modulating means we arranged symmetrically with respect to a center of the exposure area.

16. The exposing device according to claim 1, wherein the modulating means is disposed with a slight inclination forming a predetermined angle with respect to a scanning direction.

17. An exposing device including modulating means which has a plurality of pixels and modulates, per pixel, an optical beam irradiated from a light source, for exposing a plotted image on an exposure surface by modulating, per pixel, the plurality of pixels of the modulating means based on image data, the multi beam exposing device comprising:
    beam position detecting means for detecting exposure point positional information pertaining to an optical beam irradiated on the exposure surface from predetermined pixels to be measured of the modulating means, which beam position detecting means measures an exposure point of the beam at two or more measurement points which are not aligned in the scanning direction with respect to the exposing head; and
    angle detecting means for detecting an angle, with respect to the scanning direction, of the beam position detecting means at each exposure point.

18. The exposing device according to claim 17, further comprising image data correcting means for correcting, based on the angle with respect to the scanning direction of the beam position detecting means, image data to be exposed on the exposure surface, wherein the angle is detected by the angle detecting means.

19. The exposing device according to claim 17, further comprising angle adjusting means for mechanically adjusting the angle, with respect to the scanning direction, of the beam position detecting means.

20. The exposing device according to claim 17, wherein the beam position detecting means includes the slit plate and the optical detecting means, and the angle adjusting means is an actuator for turning the slit plate in the scanning direction.

21. An exposing method for effecting exposure of a plotted image on an exposure surface by using means which has a plurality of pixels and modulates, per pixel, an optical beam irradiated from a light source, and modulating, per pixel, the plurality of pixels of the modulating means, based on image data, comprising the steps of:
  detecting exposure point positional information pertaining to an optical beam irradiated on the exposure surface from predetermined pixels to be measured of the modulating means; and
  calculating a relative positional deviation between positional information pertaining to the pixels to be measured of the modulating means and exposure point positional information pertaining to each of the optical beams projected at the exposure surface from each of the pixels to be measured, detected at the previous step, based on the two positional informations.

22. The exposing method according to claim 21, further comprising the step of calculating a distortion of a plotted image based on the relative positional deviation calculated by the positional deviation calculating step.

23. The exposing method according to claim 22, further comprising the step of correcting image data based on the distortion of the plotted image calculated by the distortion calculating step.

24. The exposing device method according to claim 21, further comprising the step of mechanically adjusting an angle, with respect to the scanning direction, of means for detecting exposure point positional information pertaining to an optical beam used in the exposure point positional information detecting step.

25. An exposing method for effecting exposure of a plotted image on an exposure surface by using means which has a plurality of pixels and modulates, per pixel, an optical beam irradiated from a light source, and modulating, per pixel, the plurality of pixels of the modulating means based on image data, comprising the step of:
  detecting exposure point positional information pertaining to an optical beam irradiated on the exposure surface from predetermined pixels to be measured of the modulating means,
  wherein the exposure point positional information detecting step comprises the steps of: measuring an exposure point of the beam at two or more measurement points which are not aligned in the scanning direction with respect to the exposing head; and detecting, from the exposure point thus measured, an angle with respect to the scanning direction, of means for detecting exposure point positional information pertaining to an optical beam, i.e., beam position detecting means, used in the exposure point positional information detecting step.

26. The exposing method according to claim 25, further comprising the step of correcting, based on the angle with respect to the scanning direction of the beam position detecting means, image data to be exposed on the exposure surface.

27. The exposing method according to claim 25, further comprising the step of mechanically adjusting the angle, with respect to the scanning direction, of the beam position detecting means.

* * * * *